United States Patent [19]

Imanaka

[11] Patent Number: 4,949,351
[45] Date of Patent: Aug. 14, 1990

[54] SURFACE-EMITTING SEMICONDUCTOR LASER AND MANUFACTURING METHOD OF SAME

[75] Inventor: Koichi Imanaka, Kyoto, Japan

[73] Assignee: Omron Tateisi Electronics Co., Kyoto, Japan

[21] Appl. No.: 337,095

[22] Filed: Apr. 12, 1989

[30] Foreign Application Priority Data

Apr. 15, 1988 [JP] Japan .................................. 63-91632

[51] Int. Cl.$^5$ ........................ H01S 3/19; H01L 27/12; H01L 33/00
[52] U.S. Cl. ........................................ 372/45; 357/4; 357/17; 372/46
[58] Field of Search .................................. 372/43–46; 11/99; 357/4, 17

[56] References Cited

FOREIGN PATENT DOCUMENTS

| 0081888 | 5/1985 | Japan | 372/45 |
| 0174687 | 8/1986 | Japan | 372/45 |
| 01214493 | 9/1986 | Japan | 372/45 |

OTHER PUBLICATIONS

Iga et al., "Microcavity GaAlAs/GaAs Surface Emitting Laser D.H. $I_{th}=6mA$", *Electronics Letters*, Jan. 29, 1987, vol. 23, No. 3, pp. 134–136.

*Primary Examiner*—William L. Sikes
*Assistant Examiner*—Georgia Y. Epps
*Attorney, Agent, or Firm*—Dickstein, Shapiro and Morin

[57] ABSTRACT

A surface-emitting semiconductor laser having a lower reflection mirror including a semiconductor multilayer disposed on an n-type substrate so as to form an upper reflection mirror with TiPtAu such that a double heterojunction between the lower and upper reflection mirrors is configured in a columnar shape and that an insulating material is buried in a periphery of the double heterojunction. The non-alloyed metal of TiPtAu serves three functions of an ohmic metal, a reflective layer, and an etching mask.

3 Claims, 4 Drawing Sheets

SURFACE-EMITTING SEMICONDUCTOR LASER AND MANUFACTURING METHOD OF SAME

BACKGROUND OF THE INVENTION

1. Field of the Invention

The present invention relates to a semiconductor laser of a surface-emitting type in which a light is emitted therefrom in a direction perpendicular to a surface of a crystalline substrate.

2. Description of the Prior Art

As an example of the conventional semiconductor laser of a surface emitting type, there has been described a laser in "Microcavity GaAlAs/GaAs Surface-Emitting Laser with Ith=6 mA", K. IGA et al, Electronics Letters, 29th Jan., 1987, Vol. 23, NO. 3, pp. 134–136. FIG. 4 shows constituent portions of the semiconductor laser described in this article, the portions being related to the present invention.

In this structure, the laser comprises an n-side ohmic metal (AuGe) 21, an n-GaAs substrate 22, a reflective multilayer of $SiO_2/TiO_2$ 23, an n-AlGaAs clad layer 24, an active layer of GaAs 25, a p-AlGaAs clad layer 26, a buried layer 27 formed by the second growth, an insulation layer 28, and a p-type ohmic electrode (AuZn) 29 also functioning as a reflection mirror.

The conventional semiconductor laser of a surface-emitting type has been attended with the following problems.

(1) There are required two crystal growth processes.

(2) Since the light is emitted from a rear surface of the substrate, this structure is not suitable for an optoelectronics integrated circuit (OEIC).

(3) A film or layer 23 having a high reflection factor is required to be fabricated on a light emitting side.

(4) A region of AuZn is employed as an electrode 29 on the side of grown layers (on the side from which the light is not emitted) and is also used as a reflection mirror. In order to prevent the electrode 29 from forming an alloy with the clad layer 26, which lowers the reflection factor, there is first disposed an insulation film 28 so as to fabricate therein a ring-shaped window to establish a contact between the clad layer 26 and the electrode 29; in consequence, the manufacturing processes become to be complicated and there cannot be developed a favorable ohmic contact, which leads to a high resistance.

SUMMARY OF THE INVENTION

The present invention solves the problems described above.

According to the present invention, there is provided a surface-emitting semiconductor laser comprising an n-type semiconductor substrate, a lower reflection mirror including a semiconductor multilayer fabricated on the substrate, an upper reflection mirror formed with TiPtAu, a double heterojunction formed in a shape of a column between the reflection mirrors, and an insulator disposed to be burried in the periphery of the double heterojunction.

A method of manufacturing the surface-emitting semiconductor laser according to the present invention is characterized in that on an n-type semiconductor substrate, there is beforehand disposed a layer of a high reflection factor as a lower reflection mirror comprising a semiconductor multilayer such that an upper reflection mirror is formed with TiPtAu also functioning as a p-side ohmic electrode and that a double heterojunction between the reflection mirrors is fabricated in a columnar shape (for example, in a cylindrical shape) so as to surround the double heterojunction with an insulator.

The following effects are attained by adopting the configuration above.

(1) There is required only one crystal growth process.

(2) Since the light is emitted from the surface in an upward direction with respect to the substrate, the structure is quite suitable for the optical electronic integration circuit (OEIC).

(3) Since the film having a high reflection factor on the substrate side is fabricated in a stage of the crystal growth, it is not additionally required to form a multilayer, for example, $SiO_2/TiO_2$.

(4) Since a non-alloyed ohmic metal TiPtAu is employed as the p-side electrode, a high reflection factor can be obtained thorough a low contact resistance without fabricating a ring-shaped electrode by use of an insulation film. That is, the Ti region establishes an ohmic contact with the semiconductor crystal and does react therewith. In addition, the Pt region disposed between the Ti region and the Au region serves as a stopper for preventing a reaction between Ti and Au.

BRIEF DESCRIPTION OF THE DRAWINGS

These and other objects and advantages of the present invention will become apparent by reference to the following description and accompanying drawings wherein:

FIGS. 1 and 2 are schematic diagrams showing an embodiment according to the present invention in which FIG. 1 is a perspective view and FIG. 2 is a cross-sectional view;

DESCRIPTION OF THE PREFERRED EMBODIMENTS

Figure 1:
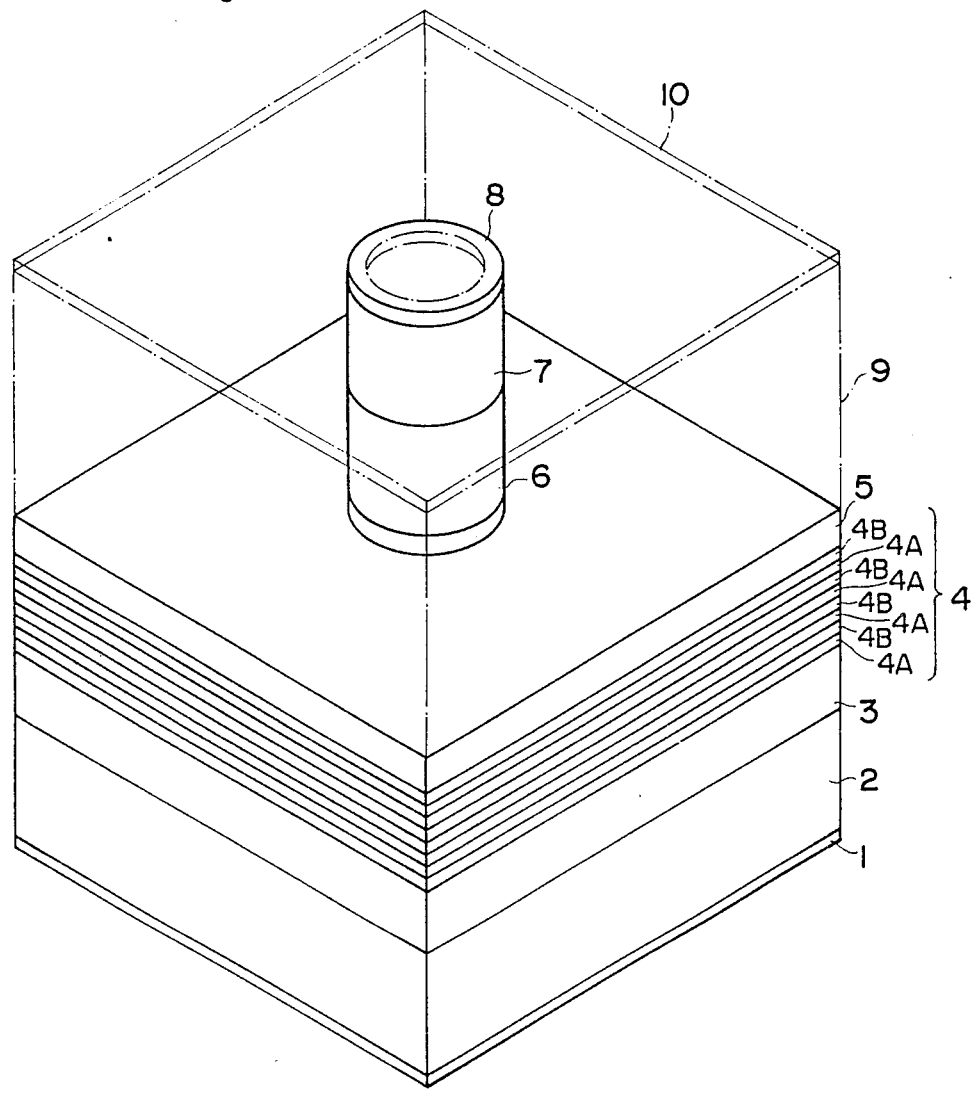
Figure 2:
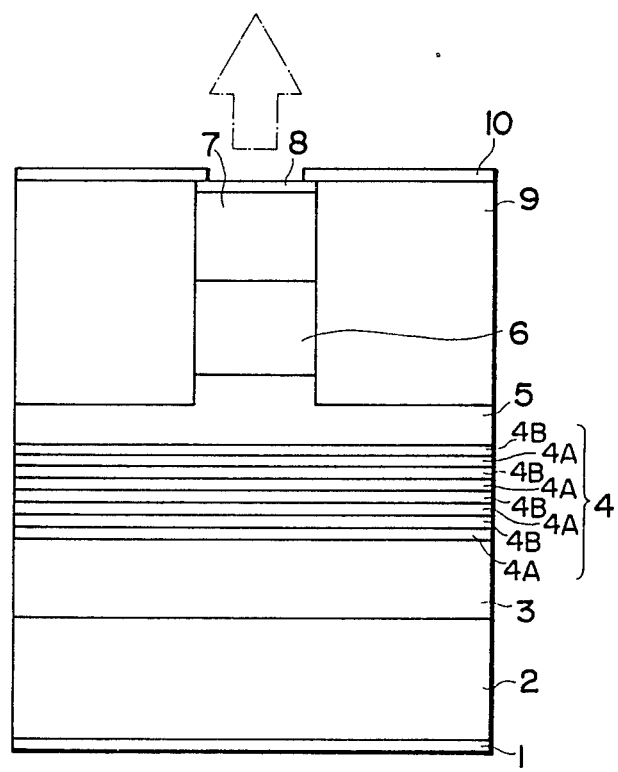

FIGS. 1 and 2 shows a concept of a surface-emitting semiconductor laser according to the present invention.

In these diagrams, the configuration includes an n-side electrode 1, an n-type semiconductor substrate 2, an n-type buffer layer 3 (which may be omitted in some cases), and a reflective multilayer 4 constituted with a plurality of pairs of layers each including semiconductor layers 4A and 4B, which are alternately grown. There are further included an n-type clad layer 5, an active layer 6, a p-type clad layer 7, and a circular p-type ohmic electrode 8 also functioning as an upper reflection mirror fabricated by sequentially piling or accumulating titanium (Ti), platinum (Pt), and gold (Au) each having a thickness of several tens to several hundreds of angstroms. The thickness of Ti, Pt, or Au is adjustable depending on a required reflection factor (for example, 95%). Reference numeral 9 designates an insulator formed with, for example, $SiO_2$, SiN, polyimide, or a-Si which has a smaller refractive index as compared with the active layer 6. Reference numeral 10 indicates a bonding metal for facilitating the assembly.

Assuming here, energy gaps and refractive indexes respectively of the semiconductor films 4A and 4B, the clad layer 5, the active layer 6, and the clad layer 7 to be represented as $(E_{4A}, n_{4A})$, $(E_{4B}, n_{4B})$, $(E_5, n_5)$, $(E_6, n_6)$, and $(E_7, n_7)$; the value of $n_6$ is set to be greater than the values of $n_{4A}$, $n_{4B}$, $n_5$, and $n_7$, respectively; furthermore, the value of $E_6$ is set to be smaller than the values of $E_{4A}$, $E_{4B}$, $E_5$, and $E_7$, respectively. In addition, for the light emitting wavelength $\lambda(nm) = 1239.8/E_6$ (eV) in the active layer 6, the values of thickness of the semiconductor layers 4A and 4B are selected to be $\lambda/4n_{4A}$ and $\lambda/4n_{4B}$, respectively. Several tens of pairs of layers each including the semiconductor layers 4A and 4B are accumulated to form the reflective multilayer 4, which causes at least 90% of the light emitted downward to be reflected thereon to the upward direction.

In the constitution above, holes injected from the upper electrode 10 (or 8) are transferred via the clad layer 7 to the active layer 6, whereas electrons injected from the lower electrode 1 are passed to the active layer 6 via the substrate 2, the buffer layer 3, the reflective multilayer 4, and the clad layer 5; in consequence, these holes and electrons are recombined to emit light. The light is reflected and is amplified between the upper reflection mirror 8 and the lower reflection mirror 4 such that a laser light beam is emitted in the upward direction.

In this situation, the clad layer 7, the active layer 6, and a portion of the clad layer 5 form a cylinderical shape having a diameter which is substantially equal to the diameter of the circular electrode 8; and since the insulator layer 9 surrounds the cylindrical region, an electric current flows only through this cylindrical portion.

According to the present invention as described above, there are attained the following effects.

(1) There is required only one crystal growth process.

(2) Since the light is emitted from the surface in an upward direction with respect to the substrate, the structure is quite suitable for an optical electronic integration circuit (OEIC).

(3) Since the film having a high reflection factor on the substrate side is fabricated in a stage of the crystal growth, it is not additionally necessary to form a multilayer, for example, $Si_2/TiO_2$ as required in the prior art.

(4) Since a non-alloyed ohmic metal TiPtAu is employed as the p-side electrode, a high reflection factor can be obtained through a low contact resistance without fabricating a ring-shaped electrode by use of an insulation film, which is employed in the conventional example. The Ti region establishes an ohmic contact with the p-type clad layer and does react therewith. In addition, the Pt region disposed between the Ti region and the Au region serves as a stopper for preventing a reaction between Ti and Au.

The respective layers above may be obtained through a bulk growth or may be configured in a superlattice structure or a quantum well structure.

Figure 3:
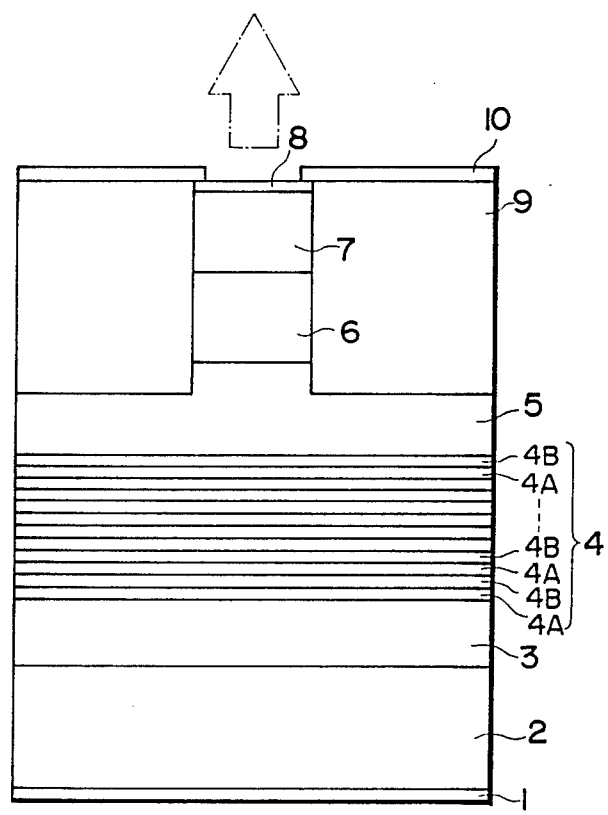
FIG. 3 is a cross-sectional view, which is identical to FIG. 2, useful to explain laser manufacturing processes.
Figure 4:
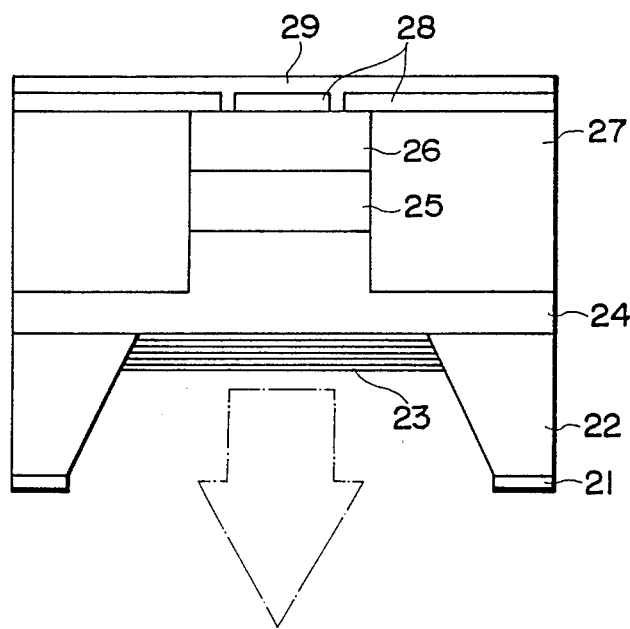
FIG. 4 is a cross-sectional view showing a conventional example.

Next, referring to FIG. 3, description will be given of an example of a method of manufacturing the surface-emission semiconductor laser. The semiconductor laser is of a type of AlGaAs/GaAs as an example.

First, on an n-type GaAs substrate, an n-$Al_{0.4}Ga_{0.6}As$ buffer layer 3 is grown such that on the buffer layer 3, there is formed a reflective multilayer 4 including 20 pairs of layers each constituted with an n-$Al_{0.9}Ga_{0.1}As$ film 4A and an n-$Al_{0.1}Ga_{0.9}As$ film 4B, which are alternately grown so as to each has a quarter of a wavelength in the crystal in thickness. In addition, on the reflection multilayer 4, there are consecutively fabricated an n-$Al_{0.4}Ga_{0.6}As$ clad layer 5, a p-GaAs active layer 6, and a p-$Al_{0.4}Ga_{0.6}As$ clad layer 7.

Thereafter, a 200 Å thick Ti film, a 200 Å thick Pt film, and a 500 Å thick Au film are formed in this order through an etching or lift-off process, thereby configuring a circular p-side electrode 8 also serving as a reflection mirror. The circular electrode 8 is further employed as an etching mask in the subsequent process.

This wafer is installed in a reactive ion etching apparatus using, for example, boron trichloride ($BCl_3$) so as to be etched with the electrode 8 used as a mask such that the periphery thereof is etched up to the clad layer 5, thereby fabricating a cylinder shape having substantially the same diameter as the circular electrode 8. Thereafter, the periphery of the double heterojunction of the cylindrical shape is filled with an insulating material 9 such as polyimide, and then there is disposed a bonding metal 10.

What is claimed is:

1. A surface-emitting semiconductor laser comprising:
    a first electrode;
    an n-type semiconductor substrate disposed on said first electrode;
    a lower reflection mirror including a semiconductor multilayer supported on said substrate;
    an upper reflection mirror formed of TiPtAu, said upper reflection mirror comprising a second electrode;
    a double heterojunction disposed between said lower reflection mirror and said upper reflection mirror, said double heterojunction comprising a first clad layer adjacent said upper reflection mirror, a second clad layer adjacent said lower reflection mirror and an active layer disposed between said first clad layer and said second clad layer; and
    an insulating material disposed around a periphery of said double heterojunction so as to surround said double heterojunction, whereby said laser emits light in an upward direction away from a side of said first clad layer directed away from said first electrode.

2. A semiconductor laser according to claim 1 wherein said insulating material has a refractive index smaller than a refractive index of said double heterojunction.

3. A method of manufacturing a surface-emitting semiconductor laser comprising the steps of:
    providing a first electrode;
    providing an n-type substrate disposed on said first electrode;
    forming a lower reflection mirror including a semiconductor multilayer on said n-type substrate;
    fabricating an upper reflection mirror formed of TiPtAu, said upper reflection mirror also constituting a second electrode;
    forming a double heterojunction between said lower and upper reflection mirrors in a columnar shape, said double heterojunction comprising a first clad layer adjacent said upper reflection mirror, a second clad layer adjacent said lower reflection mirror and an active layer disposed between said first clad layer and said second layer; and
    providing an insulating material around a periphery of said double heterojunction to bury said double heterojunction in said insulating material.

* * * * *